United States Patent
Suzuki et al.

(10) Patent No.: US 7,768,101 B2
(45) Date of Patent: Aug. 3, 2010

(54) SEMICONDUCTOR DEVICE HAVING AN INSULATED GATE BIPOLAR TRANSISTOR AND A FREE WHEEL DIODE

(75) Inventors: Kenji Suzuki, Chiyoda-ku (JP); Hideki Takahashi, Chiyoda-ku (JP); Yoshifumi Tomomatsu, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/684,772

(22) Filed: Mar. 12, 2007

(65) Prior Publication Data

US 2008/0102576 A1     May 1, 2008

(30) Foreign Application Priority Data

Oct. 27, 2006   (JP) .............................. 2006-292486

(51) Int. Cl.
  *H01L 27/082*   (2006.01)
  *H01L 27/102*   (2006.01)
  *H01L 29/70*    (2006.01)
  *H01L 31/11*    (2006.01)

(52) U.S. Cl. ............... 257/565; 257/570; 257/E27.022; 257/E27.039

(58) Field of Classification Search ............... 257/328, 257/511, 517, 526, 552, 565, 570, 653, 655, 257/656, E27.02, E27.022, E27.039
  See application file for complete search history.

(56) References Cited

U.S. PATENT DOCUMENTS 5,023,691 A       6/1991   Hagino
5,171,696 A *   12/1992   Hagino ........................ 438/138
5,360,765 A     11/1994   Kondo et al.
5,869,372 A *    2/1999   Fujihira et al. ............... 438/268
2005/0017290 A1   1/2005   Takahashi et al.
2005/0158979 A1   7/2005   Momota et al.
2005/0258493 A1  11/2005   Aono et al.

FOREIGN PATENT DOCUMENTS

| JP | 5-21372 | 1/1993 |
| JP | 6-85269 | 3/1994 |
| JP | 6-196705 | 7/1994 |
| JP | 2004-363518 | 12/2004 |
| JP | 2005-57235 | 3/2005 |
| KR | 1997-18770 | 4/1997 |
| KR | 10-2006-0047492 | 5/2006 |

* cited by examiner

*Primary Examiner*—Hoai v Pham
(74) *Attorney, Agent, or Firm*—Oblon, Spivak, McClelland, Maier & Neustadt, L.L.P.

(57) ABSTRACT

A p-type collector region of an IGBT and an n-type cathode region of a free wheel diode are alternately formed in a second main surface of a semiconductor substrate. A back electrode is formed on the second main surface so as to be in contact with both of the p-type collector region and the n-type cathode region, and has a titanium layer, a nickel layer and a gold layer that are successively stacked from the side of the second main surface. A semiconductor device capable of obtaining a satisfactory ON voltage in any of conduction of an insulated gate field effect transistor and conduction of the free wheel diode as well as a manufacturing method thereof can thus be obtained.

6 Claims, 4 Drawing Sheets

SEMICONDUCTOR DEVICE HAVING AN INSULATED GATE BIPOLAR TRANSISTOR AND A FREE WHEEL DIODE

BACKGROUND OF THE INVENTION

1. Field of the Invention

The present invention relates to a semiconductor device and a manufacturing method thereof, and more particularly to a semiconductor device having an insulated gate bipolar transistor and a free wheel diode and to a manufacturing method thereof.

2. Description of the Background Art

In recent years, from a viewpoint of energy saving, an inverter circuit has widely been used for control of home electric appliances and industrial power units and the like. The inverter circuit carries out power control by repeating ON and OFF of a voltage or a current by means of a power semiconductor device. If a rated voltage is 300V or greater, an insulated gate bipolar transistor (Insulated Gate Bipolar Transistor: hereinafter, abbreviated as "IGBT") is mainly used in the inverter circuit in view of its characteristics.

In many cases, the inverter circuit drives mainly an inductive load such as an induction motor, and in such a case, counter-electromotive force is generated from the inductive load. Accordingly, a free wheel diode for feedback of the current generated from the counter-electromotive force is required. A normal inverter circuit is formed by connecting an IGBT and a free wheel diode in an anti-parallel manner (Reverse Conducting IGBT). In order to achieve smaller size and light weight of such an inverter device, a semiconductor device realized as a single chip by integrating a free wheel diode and an IGBT has been developed.

For example, Japanese Patent Laying-Open Nos. 06-085269, 06-196705, 2005-057235, and the like have conventionally proposed such a semiconductor device realized as a single chip by integrating an IGBT and a free wheel diode.

In the reverse conducting IGBT, an insulated gate field effect transistor portion of an IGBT and an anode region of a free wheel diode are formed on a surface side of a semiconductor substrate, and a collector region of the IGBT and a cathode region of the free wheel diode are formed on a back surface side thereof. Then, a back electrode is formed on the back surface of the semiconductor substrate so as to be electrically connected to both of the collector region and the cathode region.

Conventionally, the back electrode has had such a structure that Al (aluminum), Mo (molybdenum), Ni (nickel), and Au (gold) are successively stacked in this order from the back surface side of the semiconductor substrate. The back electrode Al/Mo/Ni/Au can establish excellent ohmic contact with a p-type impurity. Accordingly, a satisfactory ON voltage can be obtained at the time of conduction of the insulated gate field effect transistor portion of the IGBT.

On the other hand, the back electrode Al/Mo/Ni/Au is less likely to establish excellent ohmic contact with an n-type impurity. Accordingly, the ON voltage is deteriorated at the time of conduction of the free wheel diode.

In addition, in the reverse conducting IGBT, lifetime control should be carried out by irradiating a semiconductor wafer with radiation such as electron beams, γ rays, neutron beams, ion beams, and the like. Moreover, in order to achieve excellent ohmic contact between the back electrode Al/Mo/Ni/Au and the semiconductor substrate, the semiconductor wafer should be subjected to heat treatment after the back electrode is formed.

The semiconductor wafer for the reverse conducting IGBT, however, has a smaller thickness after polishing of the back surface. Therefore, if heat treatment is performed after the back electrode is formed, warpage of the semiconductor wafer is caused due to difference in a coefficient of thermal expansion between silicon and the back electrode, which results in poorer mass productivity.

SUMMARY OF THE INVENTION

An object of the present invention is to provide a semiconductor device capable of obtaining a satisfactory ON voltage in any of conduction of an insulated gate field effect transistor portion and conduction of a free wheel diode, and a manufacturing method thereof.

Another object of the present invention is to provide a semiconductor device in which warpage due to heat treatment is less likely and a manufacturing method thereof.

A semiconductor device according to the present invention includes a semiconductor substrate, an insulated gate field effect transistor portion and a collector region of a first conductivity type of an insulated gate bipolar transistor, an anode region of the first conductivity type and a cathode region of a second conductivity type of a free wheel diode, and a back electrode. The semiconductor substrate has a first main surface and a second main surface opposed to each other. The insulated gate field effect transistor portion is formed on the first main surface side of the semiconductor substrate. The anode region is formed in the first main surface of the semiconductor substrate. The collector region is formed in the second main surface of the semiconductor substrate. The cathode region is formed in the second main surface of the semiconductor substrate. The back electrode is formed on the second main surface so as to be in contact with both of the collector region and the cathode region, and has a titanium layer, a nickel layer and a gold layer that are successively stacked from the second main surface side.

A method of manufacturing a semiconductor device according to the present invention includes the following steps.

Initially, an insulated gate field effect transistor portion of an insulated gate bipolar transistor and an anode region of a first conductivity type of a free wheel diode are formed on a side of a first main surface of a semiconductor substrate. A second main surface of the semiconductor substrate opposed to the first main surface is polished. A collector region of the first conductivity type of the insulated gate bipolar transistor is formed in the second main surface of the semiconductor substrate. A cathode region of a second conductivity type of the free wheel diode is formed in the second main surface of the semiconductor substrate. A back electrode is formed on the second main surface so as to be in contact with both of the collector region and the cathode region, by successively stacking a titanium layer, a nickel layer and a gold layer from a side of the second main surface.

According to the present invention, as the titanium layer is formed so as to be in contact with both of the collector region and the cathode region, a satisfactory ON voltage can be obtained in any of conduction of the insulated gate field effect transistor portion and conduction of the free wheel diode.

In addition, as the satisfactory ON voltage can be obtained as above, it is not necessary to perform heat treatment for achieving excellent ohmic contact between the back electrode and the semiconductor substrate after the back electrode is formed. Therefore, warpage of the semiconductor substrate due to the heat treatment is not likely.

Moreover, as the nickel layer is formed on the titanium layer, the nickel layer serves as solder in connecting the back surface side in assembly of a module, and thus excellent connection can be obtained. Further, as the gold layer is formed on the nickel layer susceptible to oxidation, oxidation of the nickel layer can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

Figure 1:
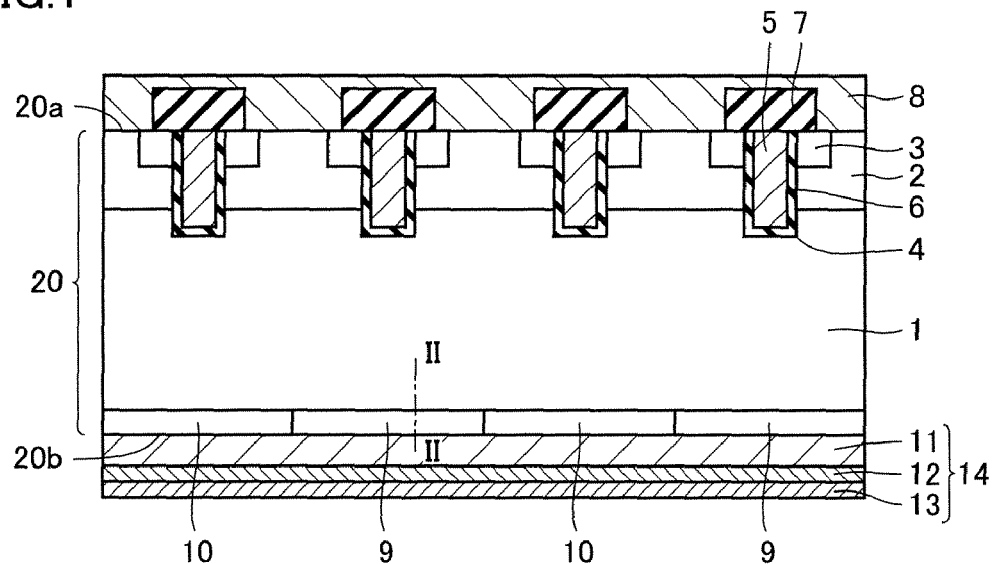
FIG. 1 is a cross-sectional view schematically showing a structure of a semiconductor device in one embodiment of the present invention.

Referring to FIG. 1, a semiconductor device in the present embodiment has an IGBT and a free wheel diode formed in a cell region of a semiconductor substrate 20. Semiconductor substrate 20 is composed, for example, of silicon having an n-type impurity introduced, and has a first main surface 20a and a second main surface 20b opposed to each other. Semiconductor substrate 20 preferably has a thickness not larger than 150 μm.

The IGBT mainly has an n⁻ semiconductor layer 1, a p-type base region 2, an n⁺ emitter region 3, a trench gate electrode 5, and a p-type collector region 9 of semiconductor substrate 20. In the cell region of semiconductor substrate 20, p-type base region 2 is selectively formed on the first main surface 20a side of n⁻ semiconductor layer 1, by diffusing a p-type impurity. In first main surface 20a within p-type base region 2, n⁺ emitter region 3 is selectively formed by selectively diffusing an n-type impurity in high concentration. A plurality of trenches 4 are formed in first main surface 20a of semiconductor substrate 20, in a manner penetrating n⁺ emitter region 3 and p-type base region 2 and reaching n⁻ semiconductor layer 1. A gate insulating layer 6 is formed along an inner wall of each trench 4, and trench gate electrode 5 is formed to fill trench 4. Trench gate electrode 5 is formed to be opposed to p-type base region 2 lying between n⁻ semiconductor layer 1 and n⁺ emitter region 3, with gate insulating layer 6 being interposed.

These n⁻ semiconductor layer 1, p-type base region 2, n⁺ emitter region 3, and trench gate electrode 5 form the insulated gate field effect transistor portion of the IGBT on the first main surface 20a side of semiconductor substrate 20. In other words, n⁻ semiconductor layer 1 and n⁺ emitter region 3 attain a function as a pair of source and drain, a part of p-type base region 2 opposed to trench gate electrode 5 with gate insulating layer 6 being interposed (peripheral portion of trench gate electrode 5) attains a function as a channel, and trench gate electrode 5 attains a function as a gate for controlling formation of the channel.

In the cell region of semiconductor substrate 20, p-type collector region 9 is selectively formed in second main surface 20b, by diffusing a p-type impurity.

The free wheel diode has n⁻ semiconductor layer 1, p-type base region 2, and an n-type cathode region 10 of semiconductor substrate 20. P-type base region 2 described above also attains a function as an anode region of the free wheel diode. In the cell region of semiconductor substrate 20, n-type cathode region 10 is selectively formed in second main surface 20b by diffusing an n-type impurity. N-type cathode region 10 and p-type collector region 9 are alternately formed, adjacent to each other.

An insulating layer 7 covering trench gate electrode 5 but exposing the surface of p-type base region 2 and n⁺ emitter region 3 is formed on first main surface 20a of semiconductor substrate 20. An emitter electrode 8 is formed on first main surface 20a so as to be in contact with the exposed surface of p-type base region 2 and n⁺ emitter region 3. Emitter electrode 8 also serves as an anode electrode of the free wheel diode.

A back electrode 14 is formed on the entire second main surface 20b of semiconductor substrate 20. Back electrode 14 comes in contact with both of p-type collector region 9 and n-type cathode region 10 in the cell region. Back electrode 14 has a titanium (Ti) layer 11, a nickel (Ni) layer 12 and a gold (Au) layer 13 that are successively stacked from the second main surface 20b side. Titanium layer 11 thus comes in contact with both of p-type collector region 9 and n-type cathode region 10. In addition, nickel layer 12 is formed to be in contact with titanium layer 11, and gold layer 13 is formed to be in contact with nickel layer 12. Back electrode 14 serves as a collector electrode of the IGBT and also as a cathode electrode of the free wheel diode.

Titanium layer 11 preferably has a thickness, for example, in a range from at least 0.05 μm to at most 0.3 μm, nickel layer 12 preferably has a thickness, for example, in a range from at least 0.3 μm to at most 2.0 μm, and gold layer 13 preferably has a thickness, for example, in a range from at least 0.02 μm to at most 0.4 μm. By doing so, characteristics of the reverse conducting IGBT can be stabilized.

Though not shown, a guard ring region is formed to surround an outer periphery of the cell region including the IGBT and the free wheel diode described above in first main surface 20a. The guard ring region is formed by diffusing a p-type impurity. The surface of the guard ring region is coated with insulating layer 7, on which a guard ring electrode is formed.

Figure 2:
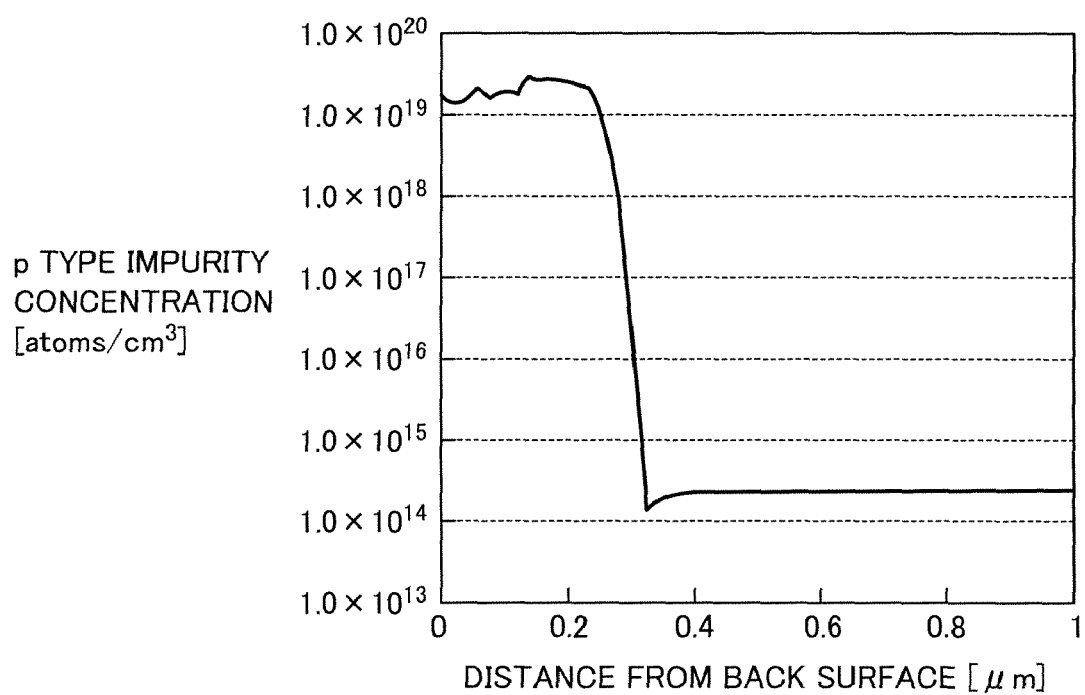
FIG. 2 shows concentration distribution of a p-type impurity in a portion along the line II-II in FIG. 1.

Referring to FIG. 2, p-type collector region 9 is formed, for example, to a depth of approximately 0.3 μm from second main surface 20b (back surface), and generally has a concentration of at least $1.0 \times 10^{19}$ cm$^{-3}$. P-type collector region 9 is preferably formed to a depth of at most 1.0 μm from second main surface 20b, and preferably has a peak concentration of at least $3.0 \times 10^{19}$ cm$^{-3}$.

If back electrode 14 is composed of Ti/Ni/Au as in the present embodiment, laser annealing which will be described later is used to control diffusion depth in p-type collector region 9 to at most 1.0 μm and to control peak concentration to at least $3.0 \times 10^{19}$ cm$^{3}$ as shown in FIG. 2, so that excellent ohmic contact between back electrode 14 and semiconductor substrate 20 is achieved and increase in the ON voltage can further be prevented.

An ON operation of the IGBT in the present embodiment will now be described with reference to FIG. 1.

Referring to FIG. 1, for the ON operation, initially, a prescribed positive collector voltage $V_{CE}$ is applied across emitter electrode 8 and back electrode 14 and a prescribed positive gate voltage $V_{GE}$ is applied across emitter electrode 8 and trench gate electrode 5, thus setting the gate to the ON state. Here, the conductivity type of a part of p-type base region 2 opposed to trench gate electrode 5 is inverted from p-type to n-type to thereby form a channel, and electrons are injected from emitter electrode 8 to n⁻ semiconductor layer 1 through the channel. The injected electrons set a forward bias state between p-type collector region 9 and n⁻ semiconductor layer 1, and holes are injected from p-type collector region 9 to n⁻ semiconductor layer 1. Thus, resistance of n⁻ semiconductor layer 1 is significantly lowered, on resistance of the insulated gate field effect transistor portion is significantly lowered, and current capacity is increased. In addition, p-type collector region 9 is formed in second main surface 20b directly under the insulated gate field effect transistor portion formed in first main surface 20a, so that a shortest path for injection of electrons and holes can be set and thus increase in the on resistance is prevented.

An ON operation of the free wheel diode in the present embodiment will now be described with reference to FIG. 1.

Referring to FIG. 1, forward bias (anode voltage $V_{AK}$) exceeding a prescribed threshold value is applied across emitter electrode 8 and back electrode 14. Then, holes are injected from p-type base region 2 to n⁻ semiconductor layer 1, and electrons are injected from n-type cathode region 10. As a result, a forward voltage ($V_F$) is significantly lowered and a current flows. In addition, n-type cathode region 10 is formed in second main surface 20b directly under the free wheel diode region formed in first main surface 20a, so that a shortest path for injection of electrons and holes can be set and thus increase in the forward voltage ($V_F$) is prevented.

A method of manufacturing a semiconductor device in the present embodiment will now be described.

Figure 3:
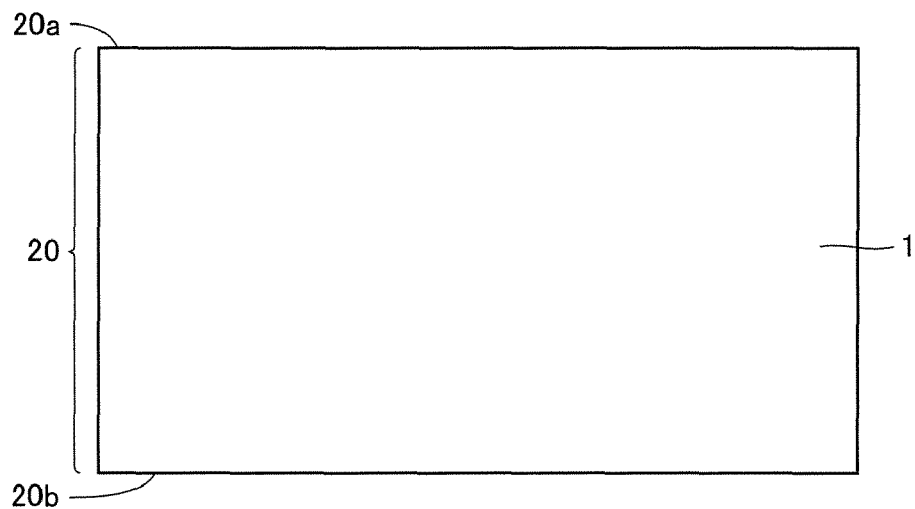
FIGS. 3 to 8 are schematic cross-sectional views showing a method of manufacturing a semiconductor device in the order of process steps in one embodiment of the present invention.

Referring to FIG. 3, semiconductor substrate 20 composed of single crystal silicon having an n-type impurity introduced is prepared. Here, semiconductor substrate 20 is generally formed of n⁻ semiconductor layer 1. Thereafter, a p-type impurity is diffused in the surface of n⁻ semiconductor layer 1 in a manner surrounding the outer periphery of the cell region in first main surface 20a, thus forming the guard ring region (not shown).

Figure 4:
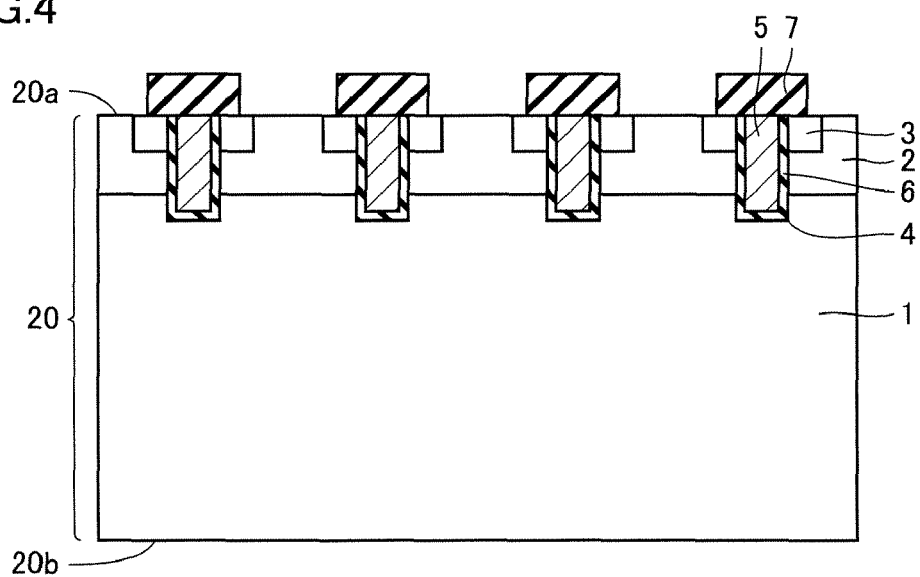

Referring to FIG. 4, the insulated gate field effect transistor portion (p-type base region 2, n⁺ emitter region 3, trench 4, gate insulating layer 6, trench gate electrode 5) of the IGBT is formed in first main surface 20a of semiconductor substrate 20. Here, as p-type base region 2 of the insulated gate field effect transistor portion also serves as the anode region of the free wheel diode, anode region 2 of the free wheel diode is simultaneously formed. Insulating layer 7 covering trench gate electrode 5 and the guard ring region but exposing the surface of p-type base region 2 and n⁺ emitter region 3 is formed on first main surface 20a.

Figure 5:
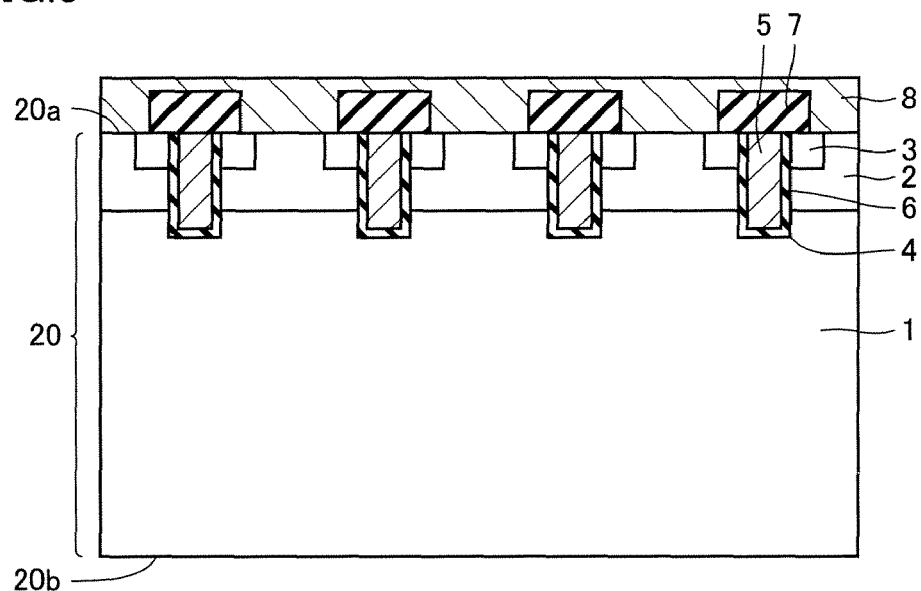

Referring to FIG. 5, emitter electrode 8 is formed so as to be in contact with p-type base region 2 and n⁺ emitter region 3, and the guard ring electrode is formed on the guard ring region. Thereafter, second main surface 20b of semiconductor substrate 20 is polished.

Figure 6:
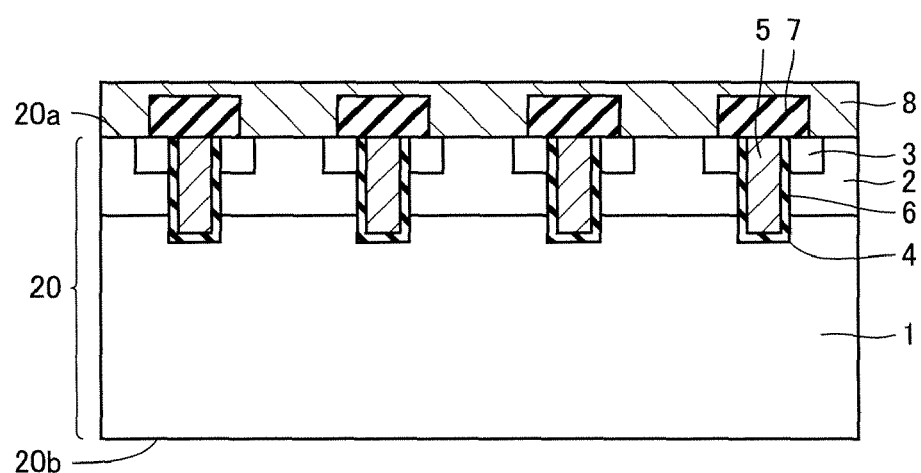

Referring to FIG. 6, as a result of polishing above, the thickness of semiconductor substrate 20 is set, for example, to 150 μm or smaller. Thereafter, the lifetime control process is performed. The lifetime control process is performed, for example, by irradiating semiconductor substrate 20 with radiation such as electron beams, γ rays, neutron beams, ion beams, and the like.

Figure 7:
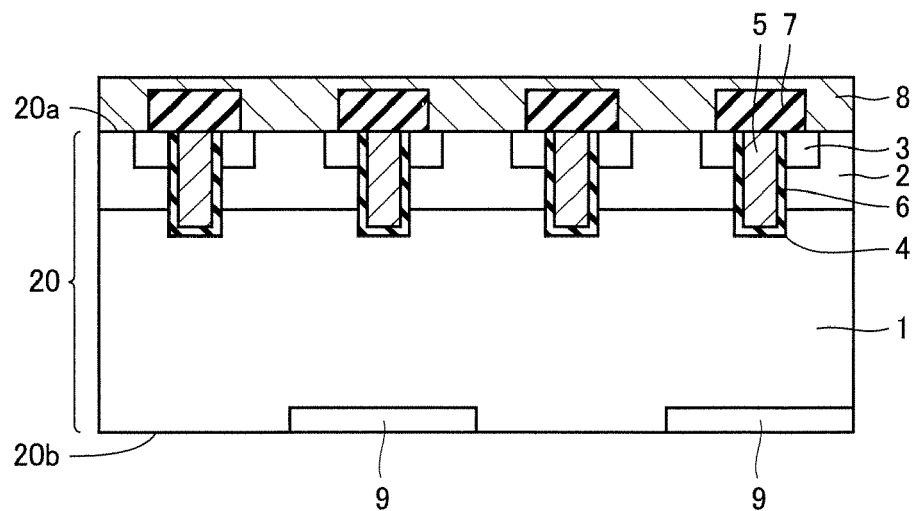

Referring to FIG. 7, a p-type impurity is selectively ion-implanted into the cell region of second main surface 20b, for example, at an acceleration voltage in a range from at least 25 keV to at most 200 keV. P-type collector region 9 is thus selectively formed in second main surface 20b.

Figure 8:
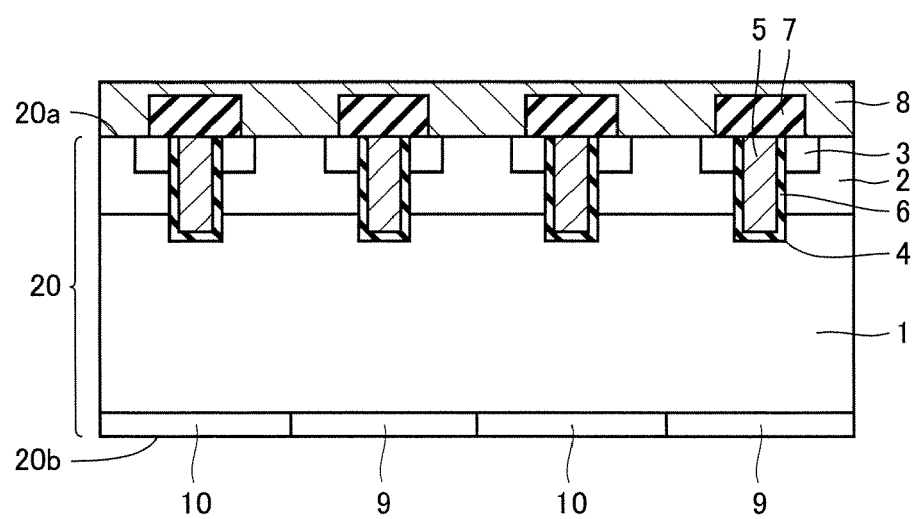

Referring to FIG. 8, an n-type impurity is selectively ion-implanted into the cell region of second main surface 20b, for example, at an acceleration voltage in a range from at least 25 keV to at most 200 keV. N-type cathode region 10 is thus selectively formed in second main surface 20b, adjacent to p-type collector region 9.

Thereafter, the p-type impurity ion-implanted in p-type collector region 9 and the n-type impurity ion-implanted in n-type cathode region 10 are activated through the same heat treatment. The heat treatment for activation is performed, for example, by using laser annealing.

Referring to FIG. 1, titanium layer 11, nickel layer 12 and gold layer 13 are successively stacked from the second main surface 20b side and formed on second main surface 20b, thus forming back electrode 14. Titanium layer 11 has a thickness, for example, in a range from at least 0.05 μm to at most 0.3 μm, nickel layer 12 has a thickness, for example, in a range from at least 0.3 μm to at most 2.0 μm, and gold layer 13 has a thickness, for example, in a range from at least 0.02 μm to at most 0.4 μm. By doing so, the characteristics are stabilized and the reverse conducting IGBT shown in FIG. 1 is manufactured.

According to the present embodiment, as titanium layer 11 is formed so as to be in contact with both of p-type collector region 9 and n-type cathode region 10, a satisfactory ON voltage can be obtained in any of conduction of the insulated gate field effect transistor portion and conduction of the free wheel diode.

In addition, as the satisfactory ON voltage can be obtained as above, it is not necessary to perform heat treatment for achieving excellent ohmic contact between back electrode 14 and semiconductor substrate 20 after back electrode 14 is formed. Therefore, warpage of semiconductor substrate 20 due to the heat treatment is not likely.

Moreover, as nickel layer 12 is formed on titanium layer 11, nickel layer 12 serves as solder in connecting the back surface side in assembly of a module, and thus excellent connection can be obtained. Further, as gold layer 13 is formed on nickel layer 12 susceptible to oxidation, oxidation of nickel layer 12 can be prevented.

In addition, by setting the thickness of semiconductor substrate 20 to 150 μm or smaller through polishing in the process steps shown in FIGS. 5 and 6, further satisfactory ON voltage of the insulated gate field effect transistor portion and the free wheel diode can be obtained.

Moreover, by performing the lifetime control process, a crystal defect (may also be referred to as "recombination center" or "lifetime control region") is formed in semiconductor substrate 20 and lifetime of carriers in semiconductor substrate 20 can be controlled. Accordingly, excellent switching characteristic can be achieved.

Further, by varying ion implantation of the p-type impurity shown in FIG. 7 and ion implantation of the n-type impurity shown in FIG. 8 under the condition that the acceleration voltage is in a range from at least 25 keV to at most 200 keV, concentration gradient of the impurity can be controlled in a direction of depth from second main surface 20b. The ON voltage of the insulated gate field effect transistor portion and the free wheel diode can thus be improved.

In addition, as heat treatment using laser annealing can be performed in the process step shown in FIG. 8 before back electrode 14 is formed, temperature increase to a level equal to or higher than the melting point of back electrode 14 can be carried out. Thus, high-concentration p-type impurity and n-type impurity can be activated solely in a surface region of second main surface 20b (to a depth of at most 1.0 μm from second main surface 20b), and an amount of impurity necessary for forming p-type collector region 9 and n-type cathode region 10 can be reduced.

Particularly, as shown in FIG. 2, by setting the peak concentration of the p-type impurity to at least $3.0 \times 10^{19}$ cm$^3$, excellent ohmic contact between p-type collector region 9 and back electrode 14 is formed and increase in the ON voltage at the time of conduction of the insulated gate field effect transistor portion can be prevented.

In addition, by activating the p-type impurity in p-type collector region 9 and the n-type impurity in n-type cathode region 10 through the same heat treatment (such as laser annealing), the heat treatment step can be curtailed as compared with the case that heat treatment is separately performed, and the manufacturing step can be simplified.

The inventors of the subject application have studied difference in the ON voltage depending on difference in a material and a structure of back electrode 14. The result of study will be described as follows.

A reverse conducting IGBT having back electrode 14 manufactured by using a material and a structure as shown in each of (1) to (3) below was prepared. Components except for the back electrode were manufactured in the same manufacturing steps as in the embodiment above.

(1) a back electrode (Ti/Ni/Au) obtained by successively forming a titanium layer, a nickel layer and a gold layer from the second main surface 20b side of semiconductor substrate 20

(2) a back electrode (Al/Ti/Ni/Au) obtained by successively forming an aluminum layer, a titanium layer, a nickel layer, and a gold layer from the second main surface 20b side of semiconductor substrate 20

(3) a back electrode (AlSi/Ti/Ni/Au) obtained by successively forming an aluminum-silicon compound layer, a titanium layer, a nickel layer, and a gold layer from the second main surface 20b side of semiconductor substrate 20

Table 1 shows a result of comparison between an ON voltage ($V_{CE(sat)}$) in conduction of a rated current in the insulated gate field effect transistor portion and an ON voltage ($V_F$) in conduction of a rated current in the free wheel diode under the same measurement conditions in these reverse conducting IGBTs.

TABLE 1

| Back Electrode | Item $V_{GE}$ | $V_{CE(sat)}$ 15 V | $V_F$ 0 V | $V_{CE(sat)}$ + $V_F$ | Heat Treatment After Back Electrode is Formed | Warpage of Wafer |
|---|---|---|---|---|---|---|
| Ti/Ni/Au | | 1.48 V | 1.29 V | 2.77 V | not performed | small |
| | | 1.47 V | 1.30 V | 2.77 V | performed | great |
| Al/Ti/Ni/Au | | 1.36 V | 1.58 V | 2.94 V | performed | great |
| AlSi/Ti/Ni/Au | | 1.41 V | 1.90 V | 3.31 V | performed | great |

It can be seen from the result shown in Table 1 that, when gate voltage $V_{GE}$ of 15V is applied across emitter electrode 8 and gate electrode 5 of the insulated gate field effect transistor portion, the sum of $V_{CE(sat)}$ and $V_F$ is lower and more satisfactory and particularly $V_F$ is better in the case where back electrode 14 has the material/structure of Ti/Ni/Au than in the case where back electrode 14 has the material/structure of other two types.

In addition, it was found that, when back electrode 14 is formed from Ti/Ni/Au, there is almost no difference between $V_{CE(sat)}$ and $V_F$ as shown in Table 1, whether heat treatment for achieving excellent ohmic contact is performed or not after back electrode 14 is formed. Namely, it was found that excellent ohmic contact at the interface between titanium and silicon can be achieved without the heat treatment above after back electrode 14 is formed. It was thus found that heat treatment after lifetime control can be performed before back electrode 14 is formed and the problem of warpage can be solved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a semiconductor substrate having a first main surface and a second main surface opposed to each other;
an insulated gate field effect transistor portion of an insulated gate bipolar transistor formed on a side of said first main surface of said semiconductor substrate;
an anode region of a first conductivity type of a free wheel diode formed in said first main surface of said semiconductor substrate;
a collector region of the first conductivity type of the insulated gate bipolar transistor formed in said second main surface of said semiconductor substrate;
a cathode region of a second conductivity type of said free wheel diode formed in said second main surface of said semiconductor substrate;
a back electrode formed on said second main surface so as to be in contact with both of said collector region and said cathode region and having a titanium layer, a nickel layer and a gold layer successively stacked from a side of said second main surface; and
an emitter electrode in contact with said anode region at said first main surface,
wherein a contact portion between said cathode region and said collector region is located directly below a contact portion between said emitter electrode and said anode region.

2. The semiconductor device according to claim 1, wherein the titanium layer is in contact with both the collector region and the cathode region.

3. The semiconductor device according to claim 1, wherein the titanium layer has a thickness within a range having a minimum value of 0.05 μm and a maximum value of 0.3 μm, the nickel layer has a thickness within a range having a minimum value of 0.3 μm and a maximum value of 2.0 μm, and the gold layer has a thickness within a range having a minimum value of 0.02 μm and a maximum value of 0.4 μm.

4. The semiconductor device according to claim 1, wherein the thickness of the semiconductor substrate has a maximum value of 150 μm.

5. The semiconductor device according to claim 1, wherein a peak concentration of a p-type impurity is set in the collector region with a minimum value of $3.0 \times 10^{19}$ cm$^{-3}$.

6. The semiconductor device according to claim 1, wherein an impurity of the first conductivity type in said collector region is diffused to a depth of at most 1.0 μm from said second main surface.

* * * * *